United States Patent [19]

Keller et al.

[11] Patent Number: 4,997,789
[45] Date of Patent: * Mar. 5, 1991

[54] ALUMINUM CONTACT ETCH MASK AND ETCHSTOP FOR TUNGSTEN ETCHBACK

[75] Inventors: Stephen A. Keller; Piper A. Spry, both of Sugar Land; Martha S. Adams, Rosenberg; Ralph G. Harper, Guy, all of Tex.

[73] Assignee: Texas Instruments Incorporated, Dallas, Tex.

[*] Notice: The portion of the term of this patent subsequent to Apr. 24, 2007 has been disclaimed.

[21] Appl. No.: 265,162

[22] Filed: Oct. 31, 1988

[51] Int. Cl.$^5$ ............... H01L 21/441; H01L 21/461
[52] U.S. Cl. ............................. 437/192; 437/194; 437/195; 437/228; 437/7; 437/190; 437/246; 357/71; 156/643; 156/646; 156/657
[58] Field of Search ............. 437/192, 194, 228, 195, 437/7, 187, 189, 245, 246, 190; 357/71; 156/643, 646, 657

[56] References Cited

U.S. PATENT DOCUMENTS

| 4,184,909 | 1/1980 | Chang et al. | 437/190 |
|---|---|---|---|
| 4,367,119 | 1/1983 | Logan et al. | 437/195 |
| 4,517,225 | 5/1985 | Broadbent | 437/245 |
| 4,630,357 | 12/1986 | Rogers et al. | 437/189 |
| 4,631,806 | 12/1986 | Poppert et al. | 437/194 |
| 4,666,737 | 5/1987 | Gimpelson et al. | 437/192 |
| 4,670,091 | 6/1987 | Thomas et al. | 156/644 |
| 4,721,689 | 1/1988 | Chaloux, Jr. et al. | 437/189 |
| 4,753,709 | 6/1988 | Welch et al. | 437/200 |
| 4,789,648 | 12/1988 | Chow et al. | 437/245 |
| 4,808,552 | 2/1989 | Anderson | 437/241 |
| 4,824,802 | 4/1989 | Brown et al. | 437/245 |
| 4,855,252 | 8/1989 | Peterman et al. | 437/189 |

Primary Examiner—Brian E. Hearn
Assistant Examiner—Tuan Nguyen
Attorney, Agent, or Firm—Gary C. Honeycutt; Melvin Sharp; N. Rhys Merrett

[57] ABSTRACT

A method for forming CVD tungsten contacts in a planarized semiconductor body. The method utilizes aluminum as an etch mask and etch stop to prevent etching of underlying layers during contact formation.

9 Claims, 3 Drawing Sheets

ALUMINUM CONTACT ETCH MASK AND ETCHSTOP FOR TUNGSTEN ETCHBACK

BACKGROUND OF THE INVENTION

The present invention relates generally to semiconductor etching techniques and more particularly to using aluminum as an etch mask and etchstop for tungsten etchback.

Various process techniques have been proposed for the planarization of contacts and vias filled with non-selective CVD tungsten. However the prior art processes do not, in practice, completely remove the CVD tungsten until lead definition. One of the reasons for this is that a high selectivity of CVD tungsten over oxide is difficult to obtain. Thus a conventional etchback step would result in thinning of the oxide over the active devices if the CVD Tungsten is etched completely during the planarization etch. Prior art attempts to increase the oxide layer thickness to allow for the over etching of the oxide also have proved unsatisfactory. One of the problems with this technique is the difficulty in controlling how much tungsten is left during the CVD tungsten planarization and accordingly how much must be etched away during the lead definition etch.

SUMMARY OF THE INVENTION

Accordingly the present invention comprises a method for using aluminum as an etchstop in the process for forming CVD tungsten filled contacts.

In accordance with another embodiment of the invention the aluminum etchstop may also be used as a mask during the contact/via etch prior to the non-selective CVD tungsten deposition. This technique has several advantages over the conventional use of a photoresist mask.

BRIEF DESCRIPTION OF THE DRAWING FIGURE

The present invention and its advantages will be best understood by reference to the detailed description which follows, when read in conjunction with the following drawings, wherein:

FIGS. 1-5 depict cross-sectional views showing various stages in a preferred embodiment of the present method for utilizing aluminum as an etch-stop.

DETAILED DESCRIPTION OF THE PREFERRED EMBODIMENTS

Figure 1:
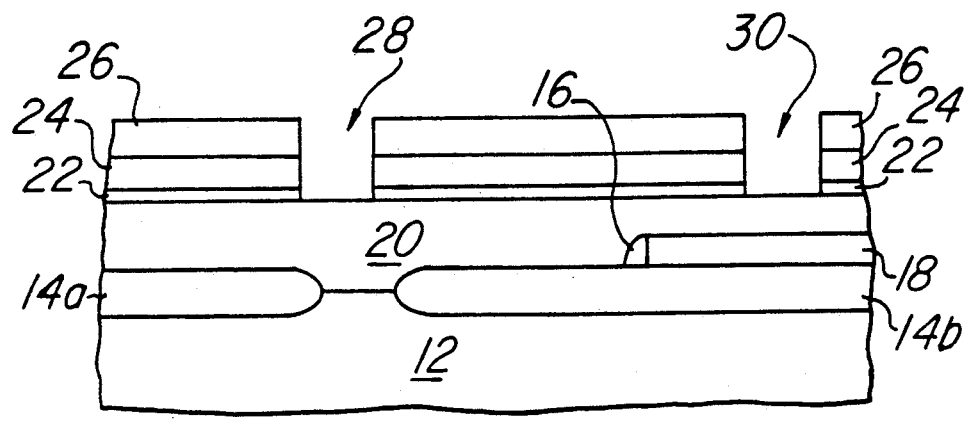

Contact and via are used interchangeably herein to describe interconnects. Referring now to the drawings, wherein like reference characters designate like or corresponding parts throughout the several views, FIG. 1 illustrates an intermediate step in the present inventive process. The FIG. 1 struture 10 comprises a conventional silicon substrate 12 having active moat area isolation oxide regions 14a-b. Overlying a portion of oxide isolation region 14b is a polysilicon emitter 18 having oxide sidewall 16. Although the structure is illustrated as a bipolar device, the teachings of the present invention are compatible with FET and BICMOS technologies. Disposed over substrate 12 is a layer of field oxide 20. Oxide layer 20 shown is pre-metal planarized or via planarized in preparation for contact/via formation in accordance with the teachings of the present invention. As shown in FIG. 1 a conventional titaninum-tungsten TiW, or other barrier metal, layer 22 is disposed on the planar oxide surface. The preferred thickness of the barrier layer is approximately 200 nanometers. However, depending on the desired device characteristics, layer 22 can be formed in the range of 0 to 400 nanometers. A thinner TiW layer helps to prevent undercutting of the TiW beneath the aluminum during the metal or oxide etch. Disposed on barrier layer 22 is approximately 200 to 300 nanometers of an aluminum or aluminum-copper alloy 24. In prior art techniques this is the metallization layer and is conventionally deposited to approximately 700 nanometers.

Next the contacts or vias are patterned and etched using conventional and well known photoresist/photolithographic techniques. The resist material is identified by reference numeral 26. Once patterned and exposed, the AlCu and TiW layers are etched in the exposed regions to the level of oxide layer 20 to define contact/via openings such as 28 and 30. If desired, the photoresist material may be stripped at this time and the substrate may be inspected to ensure that no missing or closing contacts or vias are present. If such detriments do exist it is easier to strip the metal, redeposit, repattern and reetch at. After the metal layers are etched, oxide layer 20 is now ready for etching. In accordance with the teachings of the present invention, photoresist layer 26 can be removed and aluminum layer 24 will then serve as an etch mask.

Figure 2:
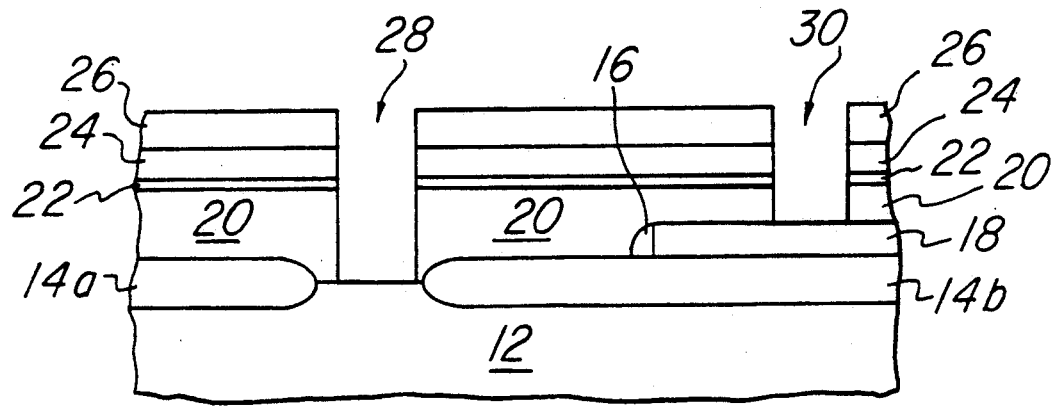
Figure 3:
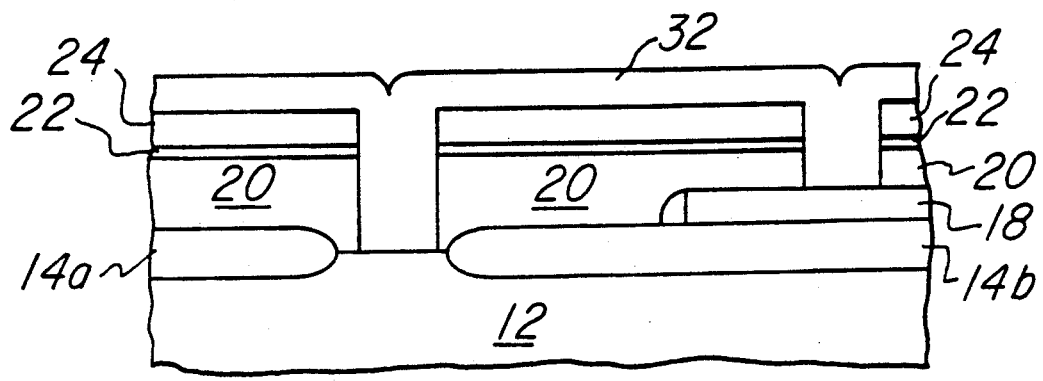

Referring now to FIG. 2, oxide layer 20 is shown etched to the surface of silicon layer 12 in contact 28 and to the surface of polysilicon layer 18 in via opening 30. As shown in FIG. 3, the remaining photoresist material 26 has been removed and a conformal layer of tungsten 32 is shown disposed over the substrate filling respective vias 28 and 30. In an alternative embodiment of the invention, a TiW "sticky layer" (not shown) of approximately 50 nanometers may be deposited over the oxide in the via openings 28 and 30 to ensure that the W will adhere to the oxide surfaces of the contact openings.

Figure 4:
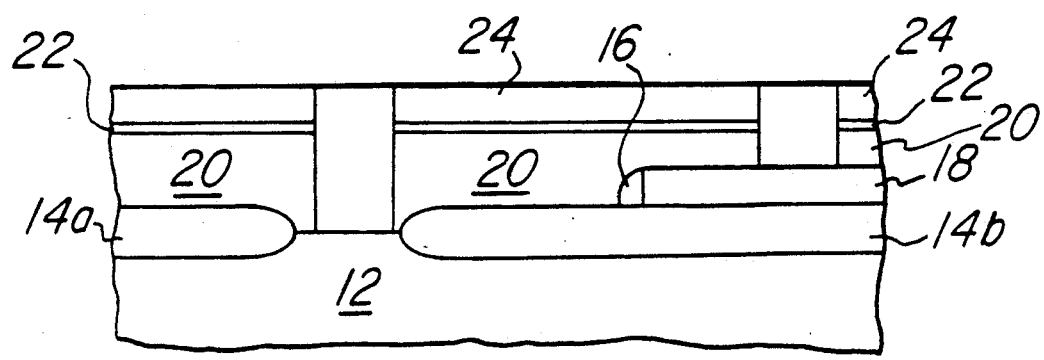
Figure 5:
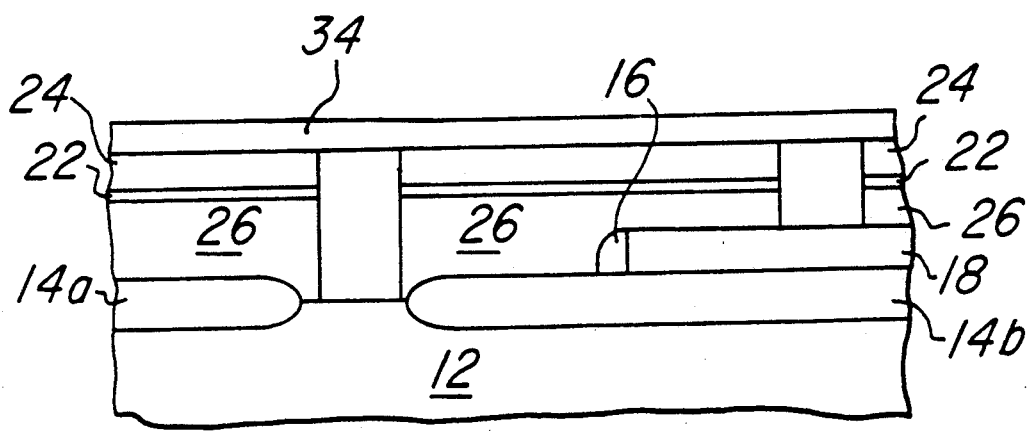

As shown in FIG. 4, a post tungsten deposition resist etchback has been performed on the substrate. The resist etchback planarizes the wafer surface, removing the W disposed on the surface of the aluminum layer. Over etching of the tungsten contacts into oxide layer 20 is prevented as heretofore mentioned because aluminum layer 24 additionally acts as an etch stop for the etching process. Thus by utilizing the present method a uniform TiW, or other material, barrier layer can be formed without the requirement that other preventive measures be taken to prevent over etching. If after the etching step the aluminum is in an acceptable condition, i.e., is not damaged and may be used for metallization, the remaining amount of aluminum 34 required for metallization may be deposited directly over aluminum layer 24, as shown in FIG. 5. If Al layer 24 is unacceptable it may be removed by such conventional techniques as an Al leach, Sherman etch, etc., down to barrier layer 22. Then the conventional metallization thickness of approximately 700 nanometers may be deposited.

As an alternative to initially using a thinner TiW layer to prevent undercutting, the aluminum could be stripped after the tungsten resist etchback and an additional amount of TiW could be deposited to correct any undercutting which may have occurred. Thereafter the aluminum can be replaced for lead definition.

The above described and disclosed process is especially well adapted for integration into processes for the formation of 1.0 micron or less contacts on a metal surface. It should be noted that an expected an intended use for the contacts so fabricated is the interconnection of integrated circuits in an IC product.

TECHNICAL ADVANTAGES OF THE INVENTION

From the foregoing the fabrication steps of a semiconductor body utilizing Al or other metallization material as an etchstop and etch mask for the etching of CVD tungsten has been disclosed. A technical advantage of the disclosed process is that during processing the aluminum will not erode as will conventional photoresist. This has the benefit of a contact profile more vertical than if conventional photoresist was used. Another attendant technical benefit over the use of photoresist is that the photoresist used to pattern the contact regions may be removed after the metal layers have been etched for the contact openings. This reduces polymer formation in the oxide etch machine.

Another technical advantage of the invention presented is that it facilitates inspection for missing or closing contacts thus allowing better opportunity for reworking the substrate. Additionally, the contacts formed in accordance with the present method have less flaring at the tops thereof.

Yet another technical advantage of the present inventive method is that high selectivity between tungsten/TiW and oxide is no longer required. Thus tungsten resist etchback is performed without thinning the CVD oxide layer over the active devices. By using the present method precise measurement of the amount of metal remaining over the CVD oxide after the planarization is not required.

The values and ranges used herein are given for a preferred embodiment of the present invention, of course these values may vary as the parameters are changed. Therefore it is to be understood that many changes in detail may be made as a matter of engineering choices without departing from the spirit and scope of the invention as defined by the appended claims.

What is claimed is:

1. A method for forming metal interconnects comprising the steps of:
   providing a planarized semiconductor body;
   depositing a barrier layer over said semiconductor body;
   depositing a metal layer over said barrier layer;
   patterning and etching said barrier and metal layers to partially form contact openings;
   removing said patterning material;
   further etching said contact openings using said metal layers as an etch mask;
   depositing a conformal layer of non-selective tungsten over said semiconductor body to fill said contact openings; and
   planarizing said tungsten surface by tungsten resist etch back, said metal layer providing an etchstop.

2. The method of claim 1, wherein said barrier layer comprises a Titanium-Tungsten alloy.

3. The method of claim 1, wherein said metal layer comprises a metal chosen from the group consisting of copper, aluminum and silicon.

4. The method of claim 1, further including the step of depositing a TiW layer before deposition of said tungsten layer.

5. The method of claim 1, further including the step of depositing additional aluminum on said previously deposited aluminum to form a conventional contact metalization layer.

6. A method for forming metal interconnects in a semiconductor body, comprising the steps of:
   forming a planarized oxide layer over said semiconductor body;
   forming a barrier layer over said planarized oxide layer;
   forming an aluminum layer over said barrier layer; and
   forming CVD tungsten contacts in said layers between the surface of said oxide layer and the surface of said semiconductor body.

7. A method of forming interconnects in a semiconductor integrated circuit, comprising the steps of:
   forming a layer of a first metal over an insulator;
   forming an opening extending through said layer of first metal and said insulator;
   forming a layer of a second metal over said layer of first metal and filling said opening, said second metal selected from the group consisting of tungsten and tungsten alloys; and
   removing a portion of said layer of second metal outside of said opening by a process selective for removal of said second metal with respect to said first metal.

8. The method of claim 7, wherein:
   said first metal is selected from the group consisting of aluminum and aluminum alloys.

9. The method of claim 8, wherein:
   said layer of first metal is on a first layer of titanium:tungsten and said first layer of titanium:tungsten is on said insulator;
   said layer of second metal is on a second layer of titanium:tungsten and said second layer of titanium:tungsten is on said layer of first metal; and
   said insulator is silicon dioxide.

* * * * *